(12) United States Patent
Kang et al.

(10) Patent No.: US 7,627,799 B2
(45) Date of Patent: Dec. 1, 2009

(54) PANEL DRIVING CIRCUIT THAT GENERATES PANEL TEST PATTERN AND PANEL TEST METHOD THEREOF

(75) Inventors: Won-Sik Kang, Seoul (KR); Jae-Goo Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 641 days.

(21) Appl. No.: 11/046,178

(22) Filed: Jan. 28, 2005

(65) Prior Publication Data
US 2005/0168458 A1 Aug. 4, 2005

(30) Foreign Application Priority Data
Jan. 29, 2004 (KR) .................. 10-2004-0005597

(51) Int. Cl.
*G01R 31/28* (2006.01)

(52) U.S. Cl. .................. 714/738; 714/742; 714/724; 714/733; 714/734; 345/50; 345/53; 345/204; 345/213; 348/181; 348/766; 348/184; 348/180

(58) Field of Classification Search .................. None
See application file for complete search history.

(56) References Cited

U.S. PATENT DOCUMENTS

| | | | | |
|---|---|---|---|---|
| 4,513,318 A | * | 4/1985 | Wilensky et al. | 348/181 |
| 5,448,260 A | * | 9/1995 | Zenda et al. | 345/100 |
| 5,502,511 A | * | 3/1996 | Nagel | 348/704 |
| 5,668,594 A | * | 9/1997 | Cahill, III | 348/194 |
| 5,696,540 A | * | 12/1997 | Katsura et al. | 345/572 |
| 6,292,182 B1 | * | 9/2001 | Park et al. | 345/211 |
| 6,784,881 B2 | * | 8/2004 | Wasserman et al. | 345/213 |
| 6,862,021 B2 | * | 3/2005 | Kudo et al. | 345/204 |

(Continued)

FOREIGN PATENT DOCUMENTS

EP 0501377 A1 * 9/1992

(Continued)

OTHER PUBLICATIONS

Japanese Translation of Patent Application Publication JP10274957 A, 8 pages, 3 PDF files.*

*Primary Examiner*—John P Trimmings
(74) *Attorney, Agent, or Firm*—F. Chau & Associates, LLC (57) ABSTRACT

A panel driving circuit that produces a panel test pattern and a method of testing a panel are provided. The driving circuit includes a pattern generation unit and a selection unit. The pattern generation unit responds to a system clock and produces pattern test data and pattern test signals. The selection unit responds to a test signal and selects and outputs either (a) the pattern test data and the pattern test signals that are outputted from the pattern generation unit, or (b) the pattern test data and pattern test signals that are directly applied from the outside. The driving circuit and the method of the panel test generates the panel test data, the horizontal synchronizing signal, the vertical synchronizing signal, and the data activating signal within the driving circuit using a system clock so that the testing of the panel can be carried out without using a separate test device.

21 Claims, 7 Drawing Sheets

U.S. PATENT DOCUMENTS

| | | | |
|---|---|---|---|
| 6,917,215 B2 * | 7/2005 | Ichikawa | 324/765 |
| 7,143,326 B2 * | 11/2006 | Fan et al. | 714/738 |
| 7,486,334 B2 * | 2/2009 | Masuda et al. | 348/563 |
| 2003/0137587 A1 * | 7/2003 | Braun | 348/181 |

FOREIGN PATENT DOCUMENTS

| | | | |
|---|---|---|---|
| JP | 05265393 | * | 10/1993 |
| JP | 10069257 | * | 3/1998 |
| JP | 10274957 A | * | 10/1998 |
| JP | 2001296507 | | 10/2001 |
| KR | P1999-0006216 | | 1/1999 |
| KR | 2000 0260362 | | 4/2000 |
| KR | 2003 0024414 | | 3/2003 |
| KR | 102001005755 | * | 3/2003 |

* cited by examiner

PANEL DRIVING CIRCUIT THAT GENERATES PANEL TEST PATTERN AND PANEL TEST METHOD THEREOF

CROSS-REFERENCE TO RELATED APPLICATIONS

This application claims the priority of Korean Patent Application No. 2004-5597, filed on Jan. 29, 2004, in the Korean Intellectual Property Office, the disclosure of which is incorporated herein in its entirety by reference.

BACKGROUND OF THE INVENTION

1. Technical Field

The present invention relates liquid crystal displays, and more particularly, to a panel driving circuit that generates pattern test data and pattern test signals for testing a panel, and a method of testing the panel using the panel driving circuit.

2. Description of the Related Art

Figure 1:
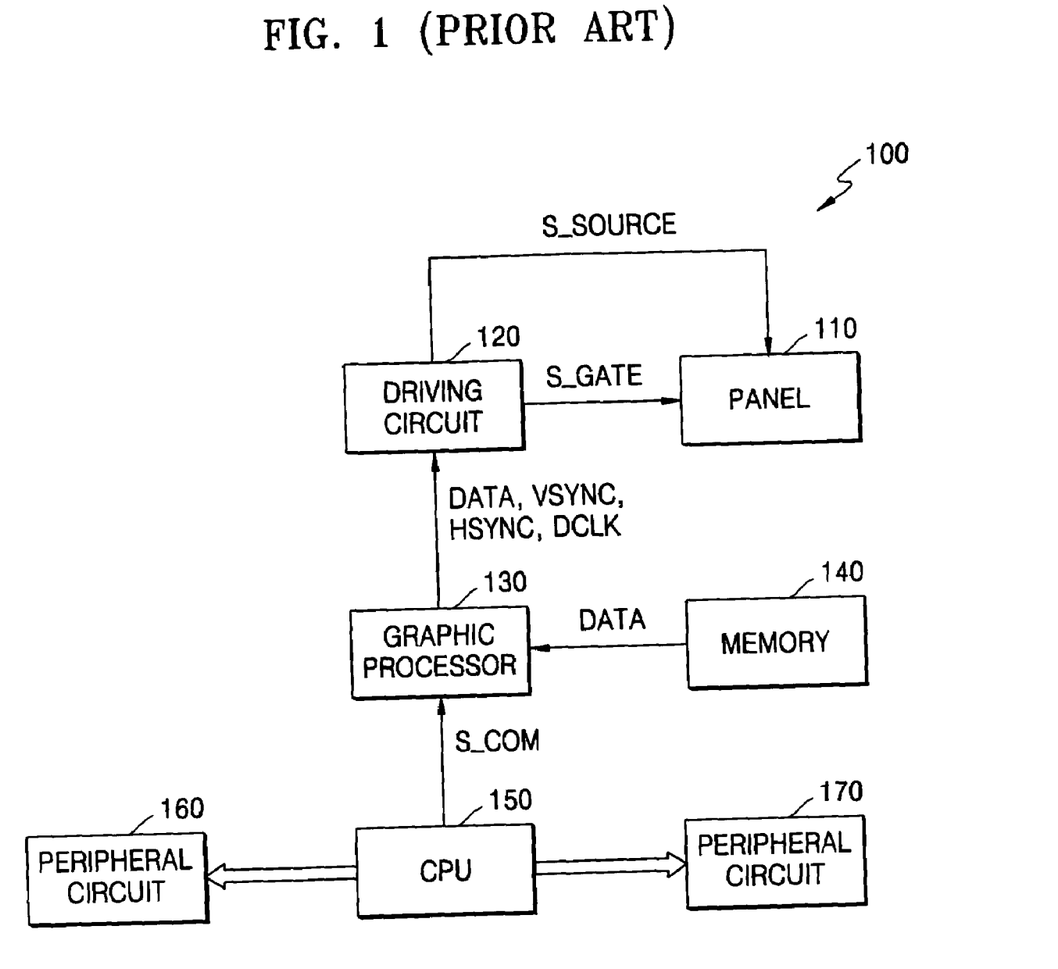
FIG. 1 is a block diagram of a conventional liquid crystal display (LCD) panel driving system.

FIG. 1 is a block diagram of a conventional liquid crystal display (LCD) panel driving system. Referring to FIG. 1, the conventional LCD panel driving system 100 includes a driving circuit 120, a graphic processor 130, a memory 140, a Central Processing Unit (CPU) 150, and peripheral circuits 160 and 170. The CPU 150 applies a control signal S_COM to the graphic processor 130 to control the panel 110 and the driving circuit 120. The memory 140 applies data DATA to the graphic processor 130. In response to the control signal S_COM outputted from the CPU 150 and the data DATA outputted from the memory 140, the graphic processor 130 applies a horizontal synchronizing signal HSYNC, a vertical synchronizing signal VSYNC, the data DATA, a system clock DCLK, and any of a variety of other inputs to the driving circuit 120 to drive the panel 110.

In response to the horizontal synchronizing signal HSYNC, the vertical synchronizing signal VSYNC, the data DATA, and the system clock DCLK inputted to the driving circuit 120, the driving circuit 120 produces a gate line control signal S_GATE and a source line control signal S_SOURCE that control a gate line (not shown) and a source line (not shown) of the panel 110, respectively. When the gate line of the panel 110 is turned on by the gate line control signal S_GATE, the data DATA is applied to the panel 110 through the source control signal S_SOURCE.

There are two operation modes of the driving circuit 120. One is a CPU interface mode in which the driving circuit 120 interfaces directly with the CPU 150 and receives the control signal S_COM from the CPU 150 directly (not shown in FIG. 1). The other, a shown in FIG. 1, is a video interface mode in which the graphic processor 130 exists between the driving circuit 120 and the CPU 150 and the driving circuit 120 interfaces directly with the graphic processor 130. A driving circuit that operates in the video interface mode is widely used in display devices of mobile communications devices like mobile phones.

An alternate version of the driving circuit 120 has fewer circuits that the CPU 150 controls and reduces the burden on the CPU 150. As a result, the alternate version of the driving circuit 120 usually adapts the video interface mode that interfaces directly with the graphic processor 130 Further, the alternate version of the driving circuit 120 can embody various image functions as well as eliminate problems, such as low image quality. Low image quality may result from a tearing condition which can occur in the CPU interface mode while reproducing a moving image. The driving circuit 120 of FIG. 1 shows the driving circuit 120 operating in the video interface mode, in which the driving circuit 120 interfaces directly with the graphic processor 130. However, the driving circuit 120 of FIG. 1 carries out a test on the panel 110 such as an image test, a reliance test, and the like, by receiving signals needed from a separate external testing device.

Figure 2:
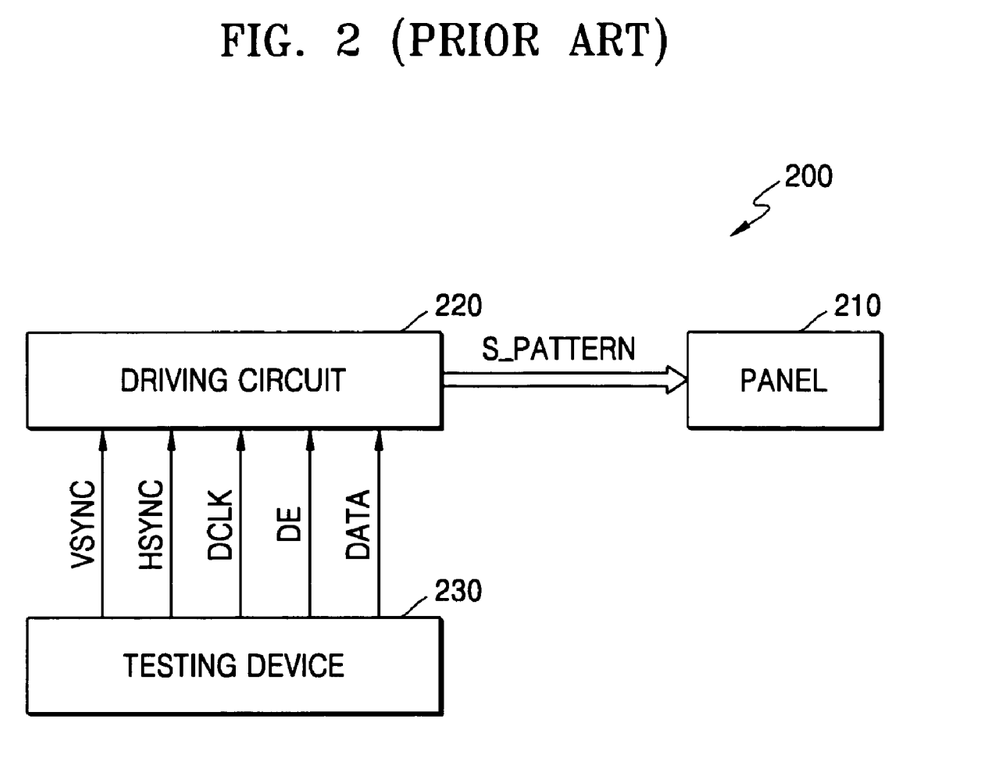
FIG. 2 is a conventional method of testing a panel using the driving circuit of FIG. 1.

FIG. 2 is a conventional method of testing a panel using the driving circuit of FIG. 1. Referring to FIG. 2, a driving circuit 220 receives signals needed to test a panel 210 from an external testing device 230.

When testing the panel 210, a test pattern S_PATTERN such as gray, cross-talk, and flicker patterns are applied to the panel 210 to check whether the panel 210 displays the test pattern S_PATTERN correctly. The driving circuit 220 receives a vertical synchronizing signal VSYNC, a horizontal synchronizing signal HSYNC, a system clock DCLK, a data activating signal DE, and data DATA and generates the test pattern S_PATTERN and applies the test pattern S_PATTERN to the panel 210.

Thus, the testing of the panel 210 using the conventional driving circuit 220 becomes more complex. The conventional driving circuit 220 receives signals for generating the test pattern S_PATTERN from the external testing device 230. As a result, the conventional driving circuit 220 must consider the conditions of the external testing device 230 and the interface between the conventional driving circuit 220 and the external testing device 230.

SUMMARY OF THE INVENTION

According to an aspect of the present invention, there is provided a driving circuit that includes a pattern generation unit and a selection unit. The pattern generation unit produces pattern test data and pattern test signals in response to a system clock. The selection unit chooses and outputs one of the pattern test data and the pattern test signals that are outputted from the pattern generation unit, and pattern test data and pattern test signals that are applied directly from the outside.

The pattern test data is data used to test an external panel, and the pattern test signals are a horizontal synchronizing signal, a vertical synchronizing signal, and a data activating signal with which the pattern test data is synchronized.

The pattern generation unit includes a first counter, a horizontal synchronizing signal generation unit, a data activating signal generation unit, a second counter, a vertical synchronizing signal, a third counter, a pattern decision making unit, and a data storage unit. The first counter calculates and outputs the number of cycles of the system clock. The horizontal synchronizing signal generation unit receives the output of the first counter and produces the horizontal synchronizing signal whenever the output of the first counter reaches a predetermined value. The data activating signal generation unit receives the output of the first counter and produces the data activating signal whenever the output of the first counter reaches a predetermined value. The second counter calculates the number of cycles of the horizontal synchronizing signals. The vertical synchronizing signal receives the output of the second counter and produces the vertical synchronizing signal whenever the output of the second counter reaches a predetermined value. The third counter calculates the number of cycles of the vertical synchronizing signals. The pattern decision making unit responds to the output of the third counter and produces a pattern signal that decides which test pattern will check the panel. The data storage unit responds to the output of the second counter and the pattern signal and outputs the pattern test data.

The predetermined value of the horizontal and the vertical synchronizing signal generation units are decided by the size of the panel. The data activating signal is activated during the cycle of the horizontal synchronizing signal except for a certain amount of time after the horizontal synchronizing signal is produced and before the next cycle of the horizontal synchronizing signal is to be produced.

The pattern decision making unit includes a plurality of the test patterns that is for examining the panel. The panel driving circuit can further include a control unit that receives the pattern test data, the pattern test signals, and the system clock, which are outputted from the selection unit, and applies the pattern test data, the pattern test signals, and the system clock to the external panel.

According to another aspect of the present invention, there is provided a method of testing a panel, in which the method of testing the panel of a driving circuit that generates pattern test data and pattern test signals to check a panel, includes: determining whether a test signal is activated or not activated; if the test signal is not activated, applying the pattern test data and the pattern test signals that are directly applied from the outside to the panel; and if the test signal is activated, in response to a system clock, generating the pattern test data and the pattern test signals and applying the pattern test data and the pattern test signals to the panel.

The generating the pattern test data and the pattern test signals, includes: calculating the number of cycles of the system clock; generating the horizontal synchronizing signal whenever the number of cycles of the system clock that is calculated reaches a predetermined value; generating the data activating signal whenever the number of cycles of the system clock reaches a predetermined value; calculating the number of cycles of the horizontal synchronizing signal; generating a vertical synchronizing signal whenever the number of cycles of the horizontal synchronizing signal reaches a predetermined value; calculating the number of cycles of the vertical synchronizing signal; in response to the vertical synchronizing signal, generating a pattern signal that decides which test pattern will check the panel; and in response to the number of cycles the horizontal synchronizing signals and the pattern signal, outputting the pattern test data.

The predetermined value to generate the horizontal synchronizing signal and the vertical synchronizing signal is decided based on the size of the panel. The data activating signal is activated during the cycle of the horizontal synchronizing signal except for a certain amount of time after the horizontal synchronizing signal is produced and before the next cycle of the horizontal synchronizing signal is to be produced.

BRIEF DESCRIPTION OF THE DRAWINGS

The above and other features of the present invention will become more apparent by describing in detail exemplary embodiments thereof with reference to the attached drawings in which.

DETAILED DESCRIPTION OF PREFERRED EMBODIMENTS

Figure 3:
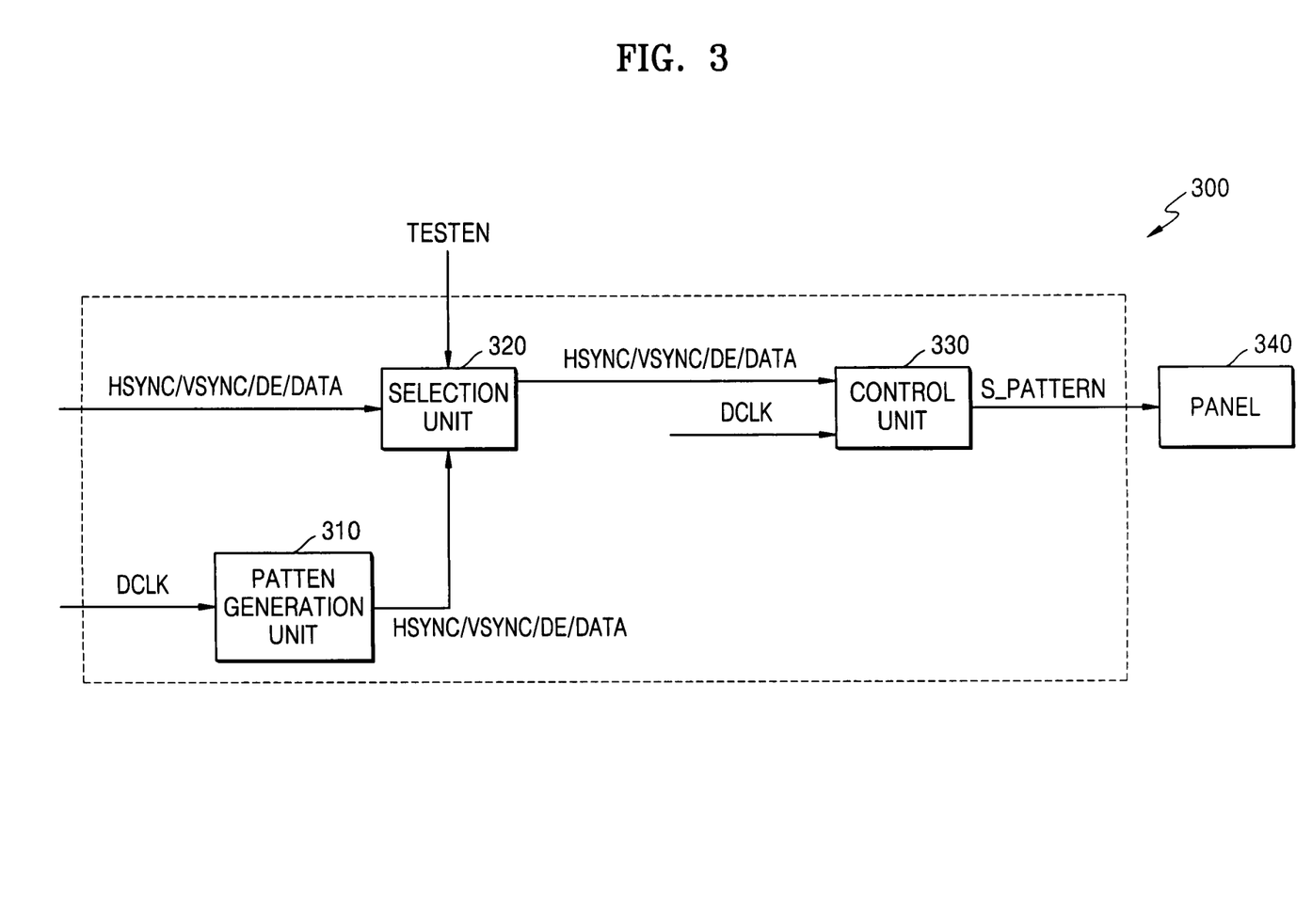
FIG. 3 is a block diagram of a driving circuit according to an exemplary embodiment of the present invention.

FIG. 3 is a block diagram of a driving circuit according to an exemplary embodiment of the present invention. Referring to FIG. 3, a driving circuit 300 according to an exemplary embodiment of the present invention includes a pattern generation unit 310 and a selection unit 320.

The pattern generation unit 310 responds to a system clock DCLK and generates pattern testing data DATA and pattern test signals HSYNC, VSYNC and DE. The selection unit 320 responds to a test signal TESTEN and selects and outputs either the pattern test data DATA and the pattern test signals HSYNC, VSYNC, and DE outputted from the pattern generation unit 310 or pattern test data DATA and pattern test signals HSYNC, VSYNC, and DE that are directly applied from the outside.

Here, the pattern test data DATA is to test an external panel 340 and the pattern test signals HSYNC, VSYNC, and DE are a horizontal synchronizing signal HSYNC, a vertical synchronizing signal VSYNC, and a data activating signal DE, with which the pattern test data DATA is synchronized.

Figure 6:
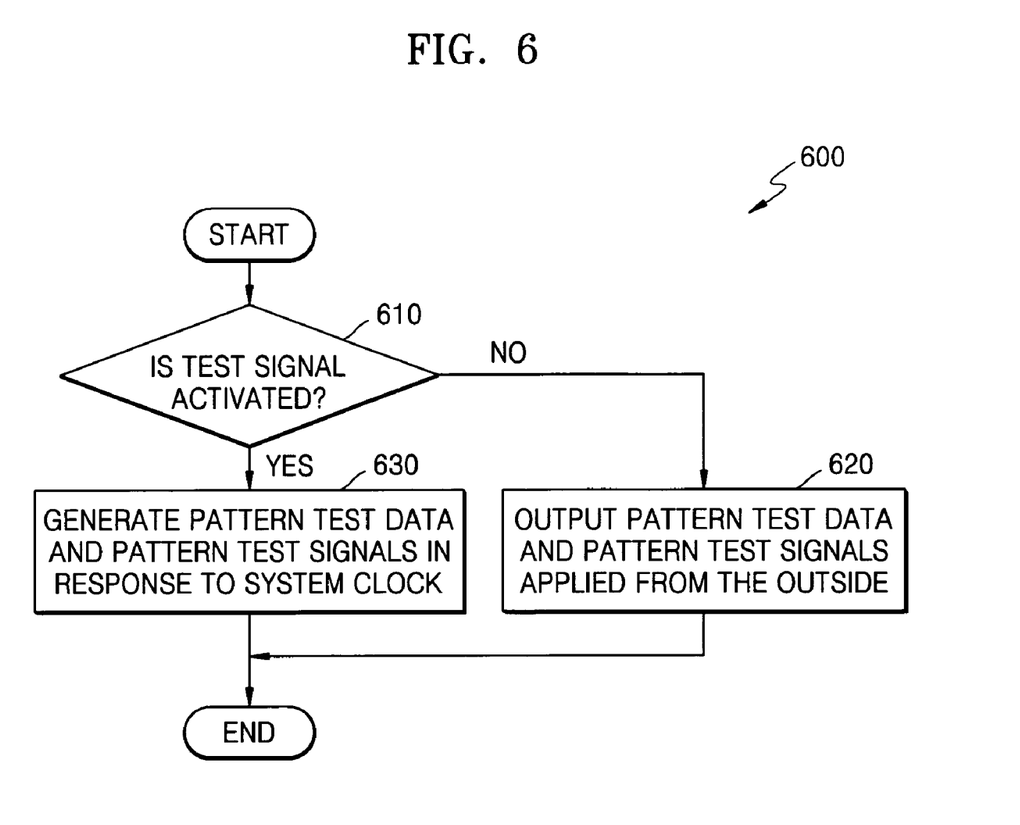
FIG. 6 is a flow chart of a method of testing a panel according to an exemplary embodiment of the present invention.
Figure 7:
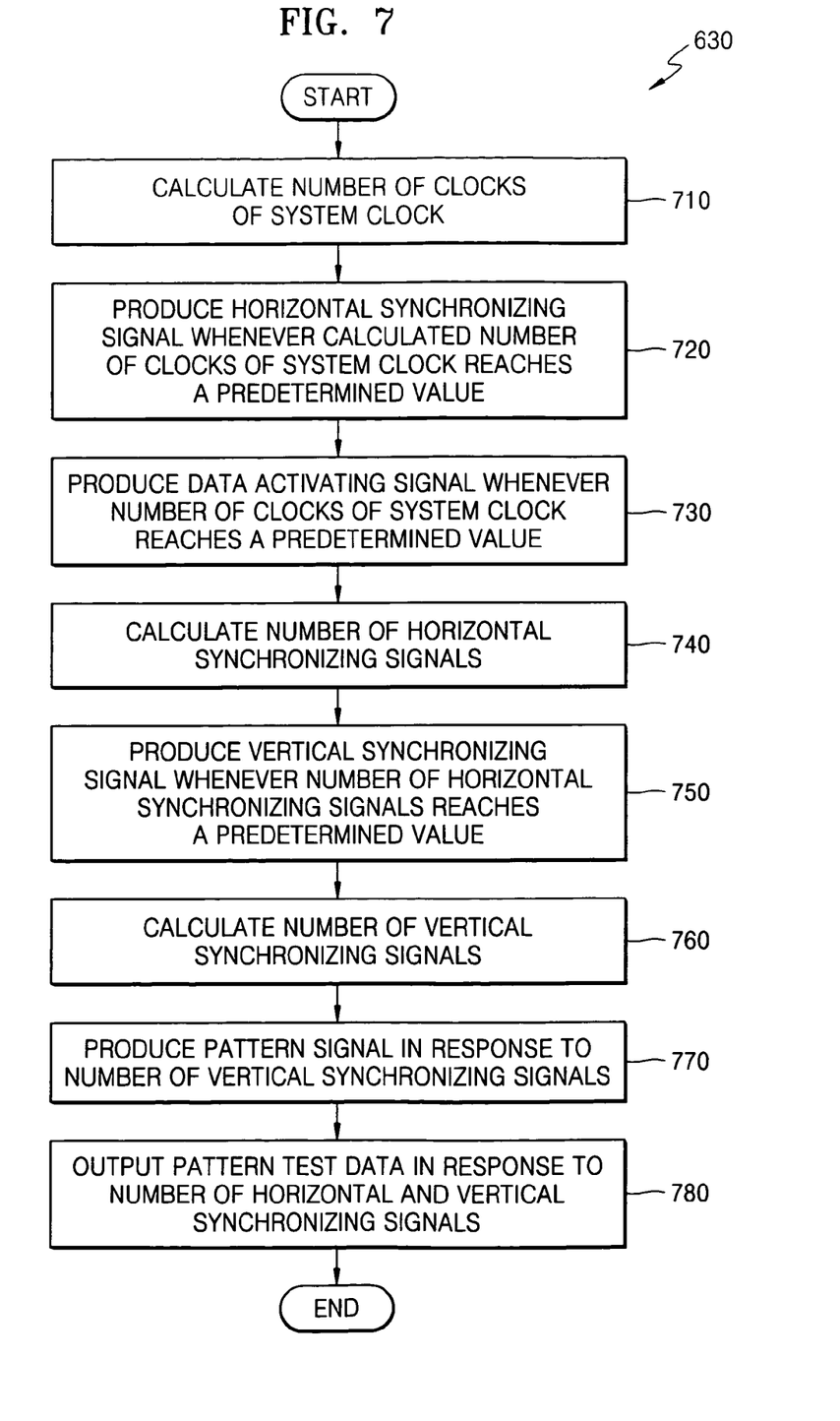
FIG. 7 is a flow chart explaining the Operation 630 of FIG. 6.

FIG. 6 is a flow chart of a method of testing a panel according to an exemplary embodiment of the present invention. FIG. 7 is a flow chart explaining the Operation 630 of FIG. 6.

Referring to FIG. 6, a method 600 of testing a panel according to an exemplary embodiment of the present invention determines whether a test signal is activated or not activated (Operation 610). If the test signal is not activated, test data and pattern test signals that are directly applied from the outside are applied to a panel (Operation 620). If the test signal is activated, pattern test data and pattern test signals are generated and applied to the panel (Operation 630) in response to a system clock.

An operation of a driving circuit and a method of testing a panel according to an exemplary embodiment of the present invention will be described below with reference to FIGS. 3 through 7.

First, it is determined whether the test signal TESTEN is activated or not (Operation 610). If the test signal TESTEN is not activated, the test data DATA and the pattern test signals HSYNC, VSYNC, and DE that are directly applied from the outside are applied to the panel 340 (Operation 620).

Operations 610 and 620 are carried out in the selection unit 320 of FIG. 3. The selection unit 320 responds to the test signal TESTEN, and if the test signal TESTEN is not activated, the selection unit 320 selects and outputs the pattern test data DATA, the horizontal synchronizing signal HSYNC, the vertical synchronizing signal VSYNC, and the data activating signal DE that are applied from the outside.

The pattern test data DATA, the horizontal synchronizing signal HSYNC, the vertical synchronizing signal VSYNC, and the data activating signal DE that are outputted from the selection unit 320 are received by a control unit 330 in response to the system clock DCLK. The control unit 330 receives the pattern test data DATA, the horizontal synchronizing signal HSYNC, the vertical synchronizing signal VSYNC, and the data activating signal DE and applies them to the external panel 340 as a test pattern S_PATTERN.

In response to the test pattern S_PATTERN, the panel 340 displays an image that corresponds to the test pattern S_PATTERN. There are many types of the test pattern S_PATTERN. For example, there is a gray pattern in which the entire panel 340 looks gray, a cross-talk pattern which makes the panel 340 look as if there is a black quadrangle inside a gray background, and the like.

If the test signal TESTEN is activated, the pattern test data DATA and the pattern test signals HSYNC, VSYNC, and DE are generated and applied to the panel 340 (Operation 630) in response to the system clock DCLK.

Operation 630 is carried out in the pattern generation unit 310 of FIG. 3. That is, if the test signal TESTEN is activated, the selection unit 320 receives the pattern test data DATA, the horizontal synchronizing signal HSYNC, the vertical synchronizing signal VSYNC, and the data activating signal DE that are outputted from the pattern generation unit 310, and the selection unit 320 outputs the pattern test data DATA, the horizontal synchronizing signal HSYNC, the vertical synchronizing signal VSYNC, and the data activating signal DE to the control unit 330. The pattern generation unit 310 receives the system clock DCLK and outputs the pattern test data DATA, the horizontal synchronizing signal HSYNC, the vertical synchronizing signal VSYNC, and the data activating signal DE.

Figure 4:
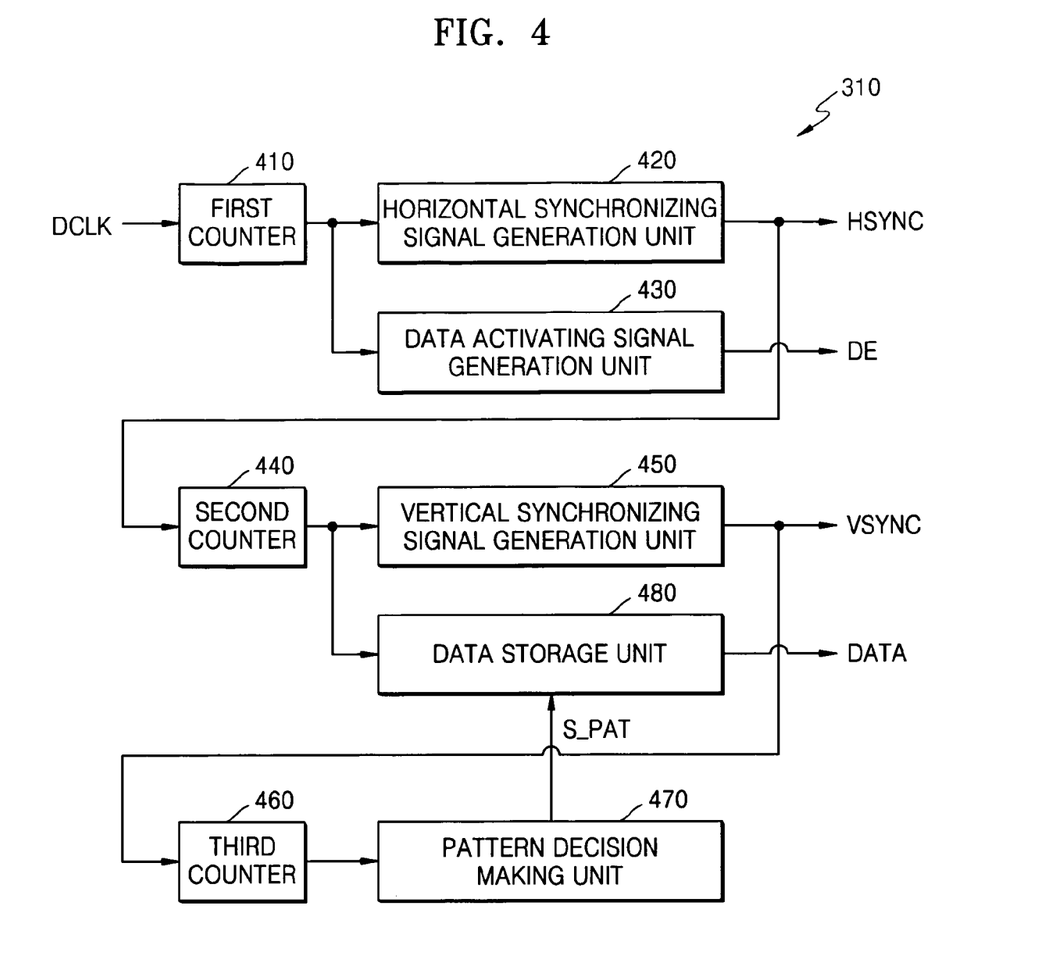
FIG. 4 is a block diagram of the pattern generation unit of FIG. 3.
Figure 5A:
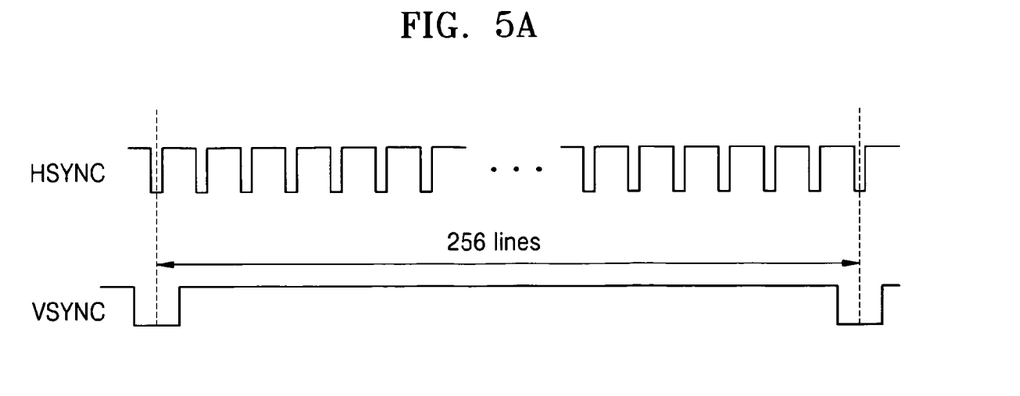
FIG. 5A is a view of a waveform of horizontal and vertical synchronizing signals, respectively, which are outputted from the pattern generation unit of FIG. 3.
Figure 5B:
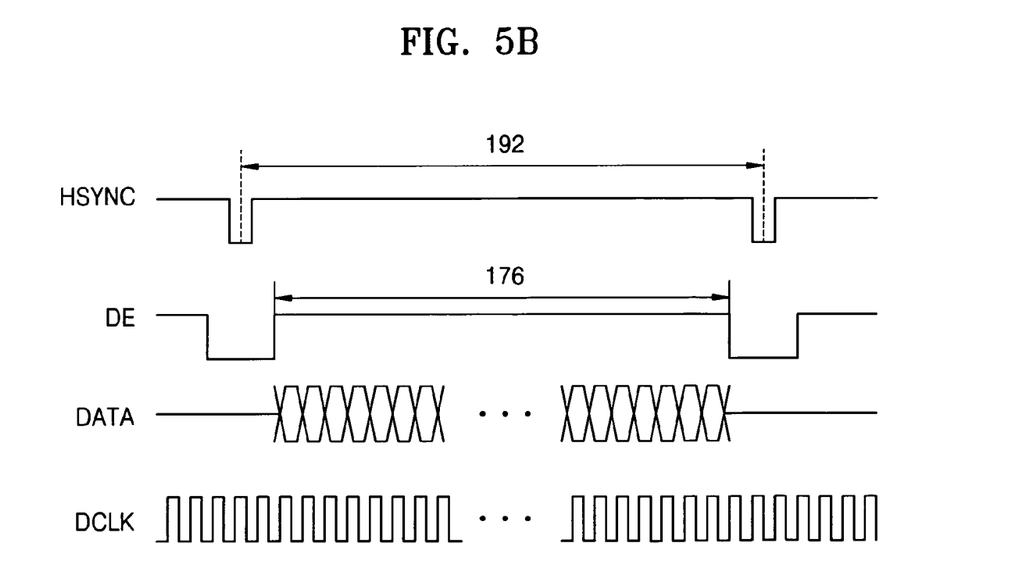
FIG. 5B is a view showing a relationship between a data activating signal, a horizontal synchronizing signal, pattern test data and a system clock, respectively.

FIG. 4 is a block diagram of the pattern generation unit 310 of FIG. 3. FIG. 5A is a view of the waveforms of the horizontal and vertical synchronizing signals HSYNC and VSYNC, respectively, that are outputted from the pattern generation unit 310 of FIG. 3 and FIG. 5B is a view showing a relationship between the data activating signal DE, the horizontal synchronizing signal HSYNC, and the pattern test data DATA and the system clock DCLK, respectively.

Referring to FIG. 4, the pattern generation unit 310 includes a first counter 410, a horizontal synchronizing signal generation unit 420, a data activating signal generation unit 430, a second counter 440, a vertical synchronizing signal generation unit 450, a third counter 460, a pattern decision making unit 470, and a data storage unit 480.

The horizontal synchronizing signal HSYNC, the vertical synchronizing signal VSYNC, and the data activating signal DE all have a predetermined relationship with the system clock DCLK. In other words, when the number of clock cycles of the system clock DCLK reaches a predetermined number, the horizontal synchronizing signal HSYNC is activated. Also, whenever the horizontal synchronizing signal HSYNC is produced for a certain time, the vertical synchronizing signal VSYNC is generated. The data activating signal DE also has a predetermined relationship with the horizontal synchronizing signal HSYNC. Therefore, the horizontal synchronizing signal HSYNC, the vertical synchronizing signal VSYNC, and the data activating signal DE can be generated from the system clock DCLK.

The driving circuit 300 of FIG. 3 includes the pattern generation unit 310 that generates signals such as the horizontal synchronizing signal HSYNC, the vertical synchronizing signal VSYNC, and the data activating signal DE using the system clock DCLK. This is unlike the conventional driving circuit, as described in greater detail above in FIG. 2, in which signals such as the horizontal synchronizing signal HSYNC, the vertical synchronizing signal VSYNC, and the data activating signal DE are received through an external testing device 230. Consequently, the driving circuit 300 of FIG. 3, without the need for any separate, external testing device, can test the panel 340 by outputting the test pattern S_PATTERN needed for testing the panel 340.

Operation 630 includes Operation 710 which calculates the number of clock cycles of the system clock DCLK. Operation 710 is carried out by the first counter 410 of FIG. 4. In other words, the first counter 410 of the pattern generation unit 310 calculates and outputs the number of clock cycles of the system clock DCLK.

Then, whenever the calculated number of clock cycles of the system clock DCLK reaches a predetermined value, the horizontal synchronizing signal HSYNC is generated (Operation 720). Operation 720 is carried out by the horizontal synchronizing signal generation unit 420. The horizontal synchronizing signal generation unit 420 receives the output of the first counter 410, and whenever the output of the first counter 410 reaches a predetermined value, the horizontal synchronizing signal HSYNC is produced.

The predetermined value of the first counter 410 to generate the horizontal synchronizing signal HSYNC is determined by the size of the panel 340. For example, it is presumed that a single horizontal line of the panel 340 has 192 system clock cycles. The horizontal synchronizing signal HSYNC is activated at each horizontal line of the panel 340. Therefore, the horizontal synchronizing signal generation unit 420 receives the output from the first counter 410, and when the output of the first counter 410 reaches 192, the horizontal synchronizing signal generation unit 420 generates the horizontal synchronizing signal HSYNC.

Whenever the number of clock cycles of the system clock DCLK reaches a predetermined value, the data activating signal DE is produced (Operation 730). Operation 730 is carried out by the data activating signal generation unit 430 of FIG. 4.

The data activating signal generation unit 430 receives the output of the first counter 410 and whenever the output of the first counter 410 reaches a predetermined value, the data activating signal DE is produced. The data activating signal DE is activated during the cycle of the horizontal synchronizing signal HSYNC except for a certain amount of time after the horizontal synchronizing signal HSYNC is produced and before the next cycle of the horizontal synchronizing signal HSYNC is to be produced.

If it is assumed that the certain amount of time before and after the horizontal synchronizing signal HSYNC during which the data activating signal DE is not activated is 8 system clock DCLK cycles each, the data activating signal DE is activated for 176 system clock DCLK cycles and not activated for the rest of the clock cycles, i.e., for 16 system clock DCLK cycles. A waveform of the data activating signal DE is illustrated in FIG. 5B.

Next the number of clock cycles of the horizontal synchronizing signals HSYNC is counted (Operation 740). Operation 740 is carried out by the second counter 440 of FIG. 4. That is, the second counter 440 calculates the number of cycles of the horizontal synchronizing signals HSYNC.

Whenever the number of cycles of the horizontal synchronizing signal HSYNC reaches a predetermined value, the vertical synchronizing signal VSYNC is produced (Operation 750). Operation 750 is carried out by the vertical synchronizing signal generation unit 450 of FIG. 4. The vertical synchronizing signal generation unit 450 receives the output of the second counter 440 and whenever the output of the second counter 440 reaches a predetermined value, the vertical synchronizing signal generation unit 450 produces the vertical synchronizing signal VSYNC.

The predetermined value of the second counter 440 to produce the vertical synchronizing signal VSYNC is determined by the size of the panel 340. For example, it is assumed that a single field of the panel 340 has 256 horizontal lines. A single vertical synchronizing signal VSYNC is produced for each field of the panel 340. Therefore, the vertical synchronizing signal generation unit 450 receives the output of the second counter 440 and when the output of the second counter 440 reaches 256, the vertical synchronizing signal VSYNC is produced. A relationship between the horizontal and vertical synchronizing signals HSYNC and VSYNC is illustrated in FIG. 5A.

Next the number of the vertical synchronizing signals VSYNC is calculated (Operation 760). Operation 760 is carried out by the third counter 460 of FIG. 4.

In response to the number of the vertical synchronizing signal VSYNC, a pattern signal S_PAT, which determines the test pattern that is to check the panel 340, is generated (Operation 770). Operation 770 is carried out by the pattern decision making unit 470 of FIG. 4.

In response to the output of the third counter 460, the pattern decision making unit 470 determines a test pattern to check the panel 340. The pattern decision making unit 470 has a number of test patterns to check the panel 340.

The output of the third counter 460 shows the number of cycles of the vertical synchronizing signal VSYNC. Whenever the output of the third counter 460 increases incrementally by one, a single field (not shown) of the panel 340 changes. The single field of the panel 340 refers to a single screen that is displayed on the panel 340.

The pattern decision making unit 470 has a number of test patterns such as a cross-talk pattern and a gray pattern. Also, in response to the output of the third counter 460, the pattern decision making unit 470 decides which test pattern, i.e., which image, is to be shown on the panel 340.

Whenever the output of the third counter 460 increases incrementally by one, the test pattern may change. Also, whenever the output of the third counter 460 increases incrementally two, the test pattern may change.

If the test pattern is changed whenever the output of the third counter 460 increases incrementally by one, the test pattern, i.e., the image, that is displayed on the screen will change whenever the screen of the panel 340 changes once. If the test pattern is changed whenever the output of the third counter 460 increases incrementally by two, the test pattern, i.e., the image, will change whenever the screen of the panel 340 changes twice. The designer of the driving circuit 300 decides the number of screen changes of the panel 340 corresponding to the changes of the test pattern.

In response to the predetermined number of cycles of the horizontal synchronizing signal HSYNC and the pattern signal S_PAT, the pattern test data DATA is output (Operation 780). Operation 780 is carried out by the data storage unit 480. The data storage unit 480 responds to the output of the second counter 440 and the pattern signal S_PAT and outputs the pattern test data DATA.

The pattern signal S_PAT has information on the test pattern, i.e., the image, that is to be displayed on the screen of the panel 340. In addition, the second counter 440 calculates the number of cycles of the horizontal synchronizing signal HSYNC.

The data storage unit 480 saves data and outputs the data needed for each of the horizontal lines as the pattern test data DATA so that the image corresponding to the pattern signal S_PAT can be shown on the panel 340.

It is supposed that the test data pattern that corresponds to the pattern signal S_PAT makes the entire panel 340 look gray with a black quadrangle in the middle. In response to the output of the second counter 440, the data storage unit 480 outputs pattern test data DATA to make from the $1^{st}$ through $85^{th}$ horizontal line and from the $170^{th}$ through $256^{th}$ horizontal line among 256 horizontal lines of the panel 340 to be displayed as gray. Additionally, the data storage unit 480 outputs pattern test data DATA to be displayed as gray, black, and gray sequentially for each horizontal line from the $86^{th}$ through $169^{th}$ horizontal lines. As such, the data storage unit 480 has the pattern signal S_PAT that has information on the image to be shown on the panel 340. Further, the data storage unit 480 responds to the number of cycles of the horizontal synchronizing signal HSYNC and outputs the pattern test data DATA.

As previously described in FIG. 3, according to the driving circuit 300 of the exemplary embodiment of the present invention, when the test signal TESTEN is not activated, the pattern test data DATA and the pattern test signals HSYNC, VSYNC, and DE that are transmitted from the outside are applied to the panel 340. When the test signal TESTEN is activated, the pattern test data DATA and the pattern test signals HSYNC, VSYNC, and DE that are outputted from the pattern generation unit 310 within the driving circuit 300 are applied to the panel 340. That is, as the driving circuit 300 controls the test signal TESTEN, the driving circuit 300 can either use the conventional method for the panel test or a method of testing the panel 340 in which the driving circuit 300 itself generates the pattern test data DATA and the pattern test signals HSYNC, VSYNC, and DE.

A driving circuit and a method of testing a panel according to the present invention is provided as described above. Panel test data, a horizontal synchronizing signal, a vertical synchronizing signal, and a data activating signal that are needed for examining the quality of a panel are generated within the driving circuit using a system clock so that the testing of the panel can be carried out without having to use a separate test device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A panel driving circuit comprising:
a pattern generation unit that produces first pattern test data and first pattern test signals in response to a system clock; and
a selection unit that chooses and outputs one of (a) the first pattern test data and the first pattern test signals that are outputted from the pattern generation unit, and (b) second pattern test data and second pattern test signals that are applied directly to the selection unit and not generated by the pattern generation unit,
wherein the pattern generation unit calculates the number of cycles of the system clock and produces the first pattern test data and the first pattern test signals in response to the number of cycles of the system clock,
wherein the first pattern test data comprises data for testing an external panel,
wherein the second pattern test data and the second pattern test signals are generated by an external testing device.

2. The panel driving circuit of claim 1, and wherein the first pattern test signals comprises a horizontal synchronizing signal, a vertical synchronizing signal, and a data activating signal with which the pattern test data is synchronized.

3. The panel driving circuit of claim 2, wherein the pattern generation unit comprises:

a first counter that calculates and outputs the number of cycles of the system clock;

a horizontal synchronizing signal generation unit that receives the output of the first counter and produces the horizontal synchronizing signal whenever the output of the first counter reaches a predetermined value;

a data activating signal generation unit that receives the output of the first counter and produces the data activating signal whenever the output of the first counter reaches a predetermined value;

a second counter that calculates the number of cycles of the horizontal synchronizing signals;

a vertical synchronizing signal that receives the output of the second counter and produces the vertical synchronizing signal whenever the output of the second counter reaches a predetermined value;

a third counter that calculates the number of cycles of the vertical synchronizing signals;

a pattern decision making unit that responds to the output of the third counter and produces a pattern signal that decides which test pattern will examine the panel; and a data storage unit that (a) responds to the output of the second counter and the pattern signal, and (b) outputs the first pattern test data.

4. The panel driving circuit of claim 3, wherein the predetermined value of the horizontal and the vertical synchronizing signal generation units are decided by the size of the panel.

5. The panel driving circuit of claim 3, wherein the data activating signal is activated during the cycle of the horizontal synchronizing signal except for a certain amount of time after the horizontal synchronizing signal is produced and before the next cycle of the horizontal synchronizing signal is to be produced.

6. The panel driving circuit of claim 3, wherein the pattern decision making unit comprises a plurality of the test patterns for examining the panel.

7. The panel driving circuit of claim 1, further comprising a control unit that (a) receives the pattern test data, the pattern test signals, and the system clock, which are outputted from the selection unit, and (b) applies the pattern test data, the pattern test signals, and the system clock to the external panel.

8. A method of testing a panel, wherein a driving circuit generates pattern test data and pattern test signals to test the panel, the method comprising:

determining whether a test signal is activated or not activated;

if the test signal is activated, in response to a system clock, generating first pattern test data and first pattern test signals and applying the first pattern test data and the first pattern test signals to the panel; and if the test signal is not activated, applying second pattern test data and second pattern test signals directly to the panel, the second pattern test data and the second pattern test signals received from outside the driving circuit, wherein generating first pattern test data and first pattern test signals comprises calculating the number of cycles of the system clock and produces the first pattern test data and the first pattern test signals in response to the number of cycles of the system clock, wherein the first pattern test data comprises data for testing an external panel, wherein the second pattern test data and the second pattern test signals are generated by an external testing device.

9. The method of claim 8, the first pattern test signals comprise a horizontal synchronizing signal, a vertical synchronizing signal, and a data activating signal with which the pattern test data is synchronized.

10. The method of claim 9, wherein generating the pattern test data and the pattern test signals comprises:

calculating the number of cycles of the system clock;

generating the horizontal synchronizing signal whenever the number of cycles of the system clock that is calculated reaches a predetermined value;

generating the data activating signal whenever the number of cycles of the system clock reaches a predetermined value;

calculating the number of cycles of the horizontal synchronizing signal;

generating a vertical synchronizing signal whenever the number of cycles of the horizontal synchronizing signal reaches a predetermined value;

calculating the number of cycles of the vertical synchronizing signal;

in response to the vertical synchronizing signal, generating a pattern signal that decides which test pattern will check the panel; and in response to the number of cycles of the horizontal synchronizing signal and the pattern signal, outputting the first pattern test data.

11. The method of claim 10, wherein the predetermined value to generate the horizontal synchronizing signal and the vertical synchronizing signal is decided based on the size of the panel.

12. The method of claim 10, wherein the data activating signal is activated during the cycle of the horizontal synchronizing signal except for a certain amount of time after the horizontal synchronizing signal is produced and before the next cycle of the horizontal synchronizing signal is to be produced.

13. A system of testing a panel, wherein a driving circuit generates pattern test data and pattern test signals to test the panel, the method comprising:

means for determining whether a test signal is activated or not activated;

if the test signal is activated, in response to a system clock, means for generating first pattern test data and first pattern test signals and applying the first pattern test data and the first pattern test signals to the panel; and if the test signal is not activated, means for applying second pattern test data and second pattern test signals directly to the panel, the second pattern test data and the second pattern test signals received from outside the driving circuit, wherein the means for generating first pattern test data and first pattern test signals calculates the number of cycles of the system clock and produces the first pattern test data and the first pattern test signals in response to the number of cycles of the system clock, wherein the first pattern test data comprises data for testing an external panel, wherein the second pattern test data and the second pattern test signals are generated by an external testing device.

14. The system of claim 13, wherein means for generating the pattern test data and the pattern test signals comprises:

means for calculating the number of cycles of the system clock;

means for generating the horizontal synchronizing signal whenever the number of cycles of the system clock that is calculated reaches a predetermined value;

means for generating the data activating signal whenever the number of cycles of the system clock reaches a predetermined value;

means for calculating the number of cycles of the horizontal synchronizing signal;

means for generating a vertical synchronizing signal whenever the number of cycles of the horizontal synchronizing signal reaches a predetermined value;

means for calculating the number of cycles of the vertical synchronizing signal;

in response to the vertical synchronizing signal, means for generating a pattern signal that decides which test pattern will check the panel; and in response to the number of cycles of the horizontal synchronizing signal and the pattern signal, means for outputting the first pattern test data.

15. A panel driving circuit comprising:

a pattern generation unit that produces first pattern test data and first pattern test signals in response to a system clock; and a selection unit that chooses and outputs one of (a) the first pattern test data and the first pattern test signals that are outputted from the pattern generation unit, and (b) second pattern test data and second pattern test signals that are applied directly from outside of the pattern generation unit, wherein the pattern generation unit comprises:

a counter unit that calculates the number of cycles of the system clock and outputs the first pattern test signals in response to the number of cycles of the system clock;

a pattern decision unit that responds to at least one of the first pattern test signals and produces a pattern signal that decides which test patterns of the first test pattern data will examine the panel, wherein the pattern generation unit produces the first pattern test data in response to the pattern signal.

16. The panel driving circuit of claim 15, wherein the first pattern test data comprises data for testing an external panel, and wherein the first pattern test signals comprises a horizontal synchronizing signal, a vertical synchronizing signal, and a data activating signal with which the pattern test data is synchronized.

17. The panel driving circuit of claim 16, wherein the counter unit comprises:

a first counter that calculates and outputs the number of cycles of the system clock;

a horizontal synchronizing signal generation unit that receives the output of the first counter and produces the horizontal synchronizing signal whenever the output of the first counter reaches a predetermined value;

a data activating signal generation unit that receives the output of the first counter and produces the data activating signal whenever the output of the first counter reaches a predetermined value;

a second counter that calculates the number of cycles of the horizontal synchronizing signals; and a vertical synchronizing signal that receives the output of the second counter and produces the vertical synchronizing signal whenever the output of the second counter reaches a predetermined value, wherein the pattern decision unit comprises:

a third counter that calculates the number of cycles of the vertical synchronizing signals; and a pattern decision making unit that responds to the output of the third counter and produces a pattern signal that decides which test pattern will examine the panel, wherein the pattern generation unit further comprises:

a data storage unit that (a) responds to the output of the second counter and the pattern signal, and (b) outputs the first pattern test data.

18. The panel driving circuit of claim 17, wherein the predetermined value of the horizontal and the vertical synchronizing signal generation units are decided by the size of the panel.

19. The panel driving circuit of claim 17, wherein the data activating signal is activated during the cycle of the horizontal synchronizing signal except for a certain amount of time after the horizontal synchronizing signal is produced and before the next cycle of the horizontal synchronizing signal is to be produced.

20. The panel driving circuit of claim 17, wherein the pattern decision making unit comprises a plurality of the test patterns for examining the panel.

21. The panel driving circuit of claim 15, further comprising a control unit that (a) receives the pattern test data, the pattern test signals, and the system clock, which are outputted from the selection unit, and (b) applies the pattern test data, the pattern test signals, and the system clock to the external panel.

* * * * *